United States Patent
Nakanishi

(10) Patent No.: US 7,939,858 B2
(45) Date of Patent: May 10, 2011

(54) SEMICONDUCTOR DEVICE WITH A TRANSISTOR HAVING DIFFERENT SOURCE AND DRAIN LENGTHS

(75) Inventor: Kazuyuki Nakanishi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/536,206

(22) Filed: Aug. 5, 2009

(65) Prior Publication Data

US 2009/0289308 A1 Nov. 26, 2009

Related U.S. Application Data

(62) Division of application No. 11/653,913, filed on Jan. 17, 2007, now Pat. No. 7,592,676.

(30) Foreign Application Priority Data

Jan. 19, 2006 (JP) ................................. 2006-010717
Nov. 20, 2006 (JP) ................................. 2006-312705

(51) Int. Cl.
*H01L 27/092* (2006.01)
(52) U.S. Cl. ........ 257/206; 257/202; 257/390; 257/401; 257/374; 257/E27.108
(58) Field of Classification Search ............ 257/E27.108
See application file for complete search history.

(56) References Cited

U.S. PATENT DOCUMENTS

| | | | |
|---|---|---|---|
| 5,796,143 A | 8/1998 | Fulford et al. | |
| 6,635,935 B2 * | 10/2003 | Makino | 257/369 |
| 2003/0127697 A1 | 7/2003 | Ohta et al. | |
| 2005/0189595 A1 | 9/2005 | Okamoto et al. | |
| 2006/0125024 A1 | 6/2006 | Ishigaki | |
| 2006/0163665 A1 | 7/2006 | Chuang et al. | |

FOREIGN PATENT DOCUMENTS

JP 2004-241529 8/2004

\* cited by examiner

*Primary Examiner* — Minh-Loan T Tran
*Assistant Examiner* — Fei Fei Yeung Lopez
(74) *Attorney, Agent, or Firm* — McDermott Will & Emery LLP

(57) ABSTRACT

A cell includes a plurality of diffusion region pairs, each of the diffusion region pairs being formed by a first impurity diffusion region which is a constituent of a transistor and a second impurity diffusion region such that the first and second impurity diffusion regions are provided side-by-side in a gate length direction with a device isolation region interposed therebetween. In each of the diffusion region pairs, the first and second impurity diffusion regions have an equal length in the gate width direction and are provided at equal positions in the gate width direction, and a first isolation region portion, which is part of the device isolation region between the first and second impurity diffusion regions, has a constant separation length. In the diffusion region pairs, the first isolation region portions have an equal separation length.

10 Claims, 15 Drawing Sheets

SEMICONDUCTOR DEVICE WITH A TRANSISTOR HAVING DIFFERENT SOURCE AND DRAIN LENGTHS

CROSS REFERENCE TO RELATED APPLICATIONS

This application is a Divisional of U.S. patent application Ser. No. 11/653,913, filed on Jan. 17, 2007, now U.S. Pat. No. 7,592,676 claims priority under 35 U.S.C. §119(a) on Japanese Patent Application No. 2006-10717 filed on Jan. 19, 2006 and Japanese Patent Application No. 2006-312705 filed on Nov. 20, 2006, the entire contents of which are hereby incorporated by reference.

BACKGROUND OF THE INVENTION

1. Field of the Invention

The present invention relates to a semiconductor device designed by arranging a plurality of cells and specifically to a cell physical structure which enables suppression of variation in transistor characteristics in a cell.

2. Description of the Related Art

In recent years, in an LSI designed under a standard cell scheme, the layout pattern and arrangement of semiconductor circuit elements have been causing greater effects on the performance of the circuit along with the advancement of semiconductor process miniaturization. Therefore, high precision is required for cell circuit design, and accordingly, the importance of CAD (Computer Aided Design) tools in circuit design is increasing. For example, a circuit simulator is one of the CAD tools which have the greatest effects on design accuracy.

The circuit simulator performs a circuit simulation based on a netlist to check whether or not cells and LSI actually operate as intended by design. Herein, the "netlist" refers to data for designed cells and LSI, including the information about connections of elements, such as transistors, capacitors, resistors, etc., the information about the characteristics of elements, such as the specifications, capacitance values and resistance values of transistors, etc. The netlist can be extracted by a netlist extractor from a mask layout of designed cells and LSI.

In the process of circuit design, the most important portion of the information included in the netlist is transistor characteristic information. The transistor characteristic information represents complicated electric characteristics of transistors (hereinafter, referred to as "transistor model"). The transistor characteristic information has to include optimized model parameters in order to precisely reproduce an actual operation of transistors.

Hereinafter, a transistor structure designed based on a conventional transistor model, a commonly-employed cell structure designed using such a transistor structure, and a semiconductor device fabricated using cells which have such a cell structure are sequentially described with reference to the drawings. FIG. 11 is a schematic view showing a transistor structure, with which a conventional transistor model is described. As shown in FIG. 11, a transistor T is formed by an impurity diffusion region Dt, which is surrounded by a device isolation region S, and a polysilicon portion P. The gate G of the transistor T is formed by the lower part of the polysilicon portion P which is sandwiched by the impurity diffusion region Dt (hatched area of polysilicon portion P). The source and drain of the transistor T are formed by the impurity diffusion region Dt. Herein, the width of the gate G is represented by Wg, the length of the gate G is represented by Lg, the width of the impurity diffusion region Dt is represented by Wd, and the length of the impurity diffusion region Dt is represented by Ld.

FIG. 12 shows a cell structure designed using the transistor structure of FIG. 11. As shown in FIG. 12, a cell C is formed by a P-type transistor Tp, an N-type transistor Tn, a device isolation region S, an interface B between a P-type transistor placement region and an N-type transistor placement region, an impurity diffusion region Dbn for supplying a substrate potential to the P-type transistor, and an impurity diffusion region Dbp for supplying the substrate potential to the N-type transistor. Cell formation generally requires other elements, such as a well, contacts, metal wires, and vias, but these elements are out of the concept of the present invention and are therefore not shown in the drawings. In FIG. 12, the impurity diffusion region Dt, the polysilicon portion P, and the gate G are not specifically indicated by the reference marks for avoidance of redundancy because they have already illustrated in FIG. 11.

The cell C shown in FIG. 12 is merely an exemplary cell. Other than this, a variety of cells having desired functions can be realized by arbitrarily arranging and wiring transistors which have various widths and lengths. FIG. 13 shows a semiconductor device including a plurality of cells. As shown in FIG. 13, cells C1, C2, C3, . . . are arranged in lines and wired in order to realize an LSI having desired functions.

In the conventional transistor model for the transistor T shown in FIG. 11, only width Wg of the gate G and length Lg of the gate G are defined as parameters. However, the current drivability of the transistor varies according to the arrangement of the impurity diffusion region Dt, and therefore, sufficient accuracy cannot be secured with the conventional transistor model. Thus, when the conventional transistor model is used, it is difficult to secure design accuracy for cells and LSI. That is, to actually achieve the LSI performance expected by design, it is necessary to model the dependency on the arrangement of the impurity diffusion region Dt and define the modeled arrangement dependency as a model parameter.

Especially in recent years, because of the use of STI (Shallow Trench Isolation) as a device isolation technique, a mechanical stress caused on a channel region of the transistor by an insulator film used in a device isolation region (hereinafter, referred to as "STI stress") causes a variation in channel mobility depending on the largeness of the device isolation region, and accordingly, the current characteristic of the transistor greatly varies. This has been an outstanding factor which results in the dependency on the arrangement of the impurity diffusion region Dt in modeling.

Hereinafter, the relationship between the STI stress and the arrangement of the impurity diffusion region Dt is described with reference to FIG. 14. FIG. 14 shows a conventional cell structure. As shown in FIG. 14, a cell C is formed by P-type transistors Tp1, Tp2 and Tp3, N-type transistors Tn1, Tn2 and Tn3, and a device isolation region S. It should be noted that the impurity diffusion region Dt and gate G of each transistor are not specifically indicated by reference marks.

In FIG. 14, as for a portion of the device isolation region S between the impurity diffusion region of the P-type transistor Tp1 and the impurity diffusion region of the P-type transistor Tp2, the length of this portion in the gate length direction of the transistor is referred to as separation length Lsp1. Likewise, as for a portion of the device isolation region S between the impurity diffusion region of the P-type transistor Tp2 and the impurity diffusion region of the P-type transistor Tp3, the separation length is Lsp2. As for a portion of the device isolation region S between the impurity diffusion region of the P-type transistor Tp1 and the impurity diffusion region of the P-type transistor Tp3, the separation length is Lsp3. Likewise, separation length Lsn1 and separation length Lsn2 are also defined in the N-type transistor placement region as shown in FIG. 14.

As for a portion of the device isolation region S between the impurity diffusion region of the P-type transistor Tp1 and the impurity diffusion region of the N-type transistor Tn1, the length of this portion in the gate width direction of the transistor is referred to as separation width Ws1. Likewise, as for a portion of the device isolation region S between the impurity diffusion region of the P-type transistor Tp2 and the impurity diffusion region of the N-type transistor Tn2, the separation width is Ws2. As for a portion of the device isolation region S between the impurity diffusion region of the P-type transistor Tp3 and the impurity diffusion region of the N-type transistor Tn3, the separation width is Ws3.

Separation lengths Lsp1, Lsp2 and Lsp3 are different from one another. Separation width Ws1, Ws2 and Ws3 are different from one another. Even if the gates and impurity diffusion regions of the P-type transistors Tp1, Tp2 and Tp3 are all the same in shape and size, the arrangement of the impurity diffusion regions is irregular. Therefore, the effects of the STI stress on the transistors are different, so that a difference in current drivability of the transistors occurs.

If the effects of the STI stress were modeled and incorporated in the model parameters, highly-precise circuit design would be possible. When the arrangement of the impurity diffusion regions is complicated and irregular as shown in FIG. 14, detailed modeling is difficult. In such a case, design is carried out with variation in current drivability of the transistors, resulting in deteriorated design accuracy.

Thus, it is necessary to improve the accuracy of modeling by limiting the shape and arrangement patterns of the impurity diffusion regions such that the variation in current drivability of the transistors is reduced to even a small extent. For example, in a conventional technique disclosed in Japanese Laid-Open Patent Publication No. 2004-241529, the arrangement pattern of the impurity diffusion regions is limited by such a layout restriction that separation widths Ws1, Ws2 and Ws3 shown in FIG. 14 are uniform, whereby variation in transistor characteristics is suppressed.

The technique disclosed in Japanese Laid-Open Patent Publication No. 2004-241529 does not place a layout restriction as to separation lengths Lsp1, Lsp2 and Lsp3 shown in FIG. 14, and therefore does not entirely restrict the arrangement pattern of the impurity diffusion regions. Therefore, this technique cannot sufficiently suppress the variation in transistor characteristics.

This problem is described in more detail with reference to FIG. 15A and FIG. 15B which show cross-sectional views taken along line a-b and line c-d of FIG. 14. In FIG. 15A, the P-type transistor Tp1 is formed by a gate Gp1 and impurity diffusion regions Dtp1 and Dtp2, the P-type transistor Tp2 is formed by a gate Gp2 and impurity diffusion regions Dtp3 and Dtp4, and the P-type transistor Tp3 is formed by a gate Gp3 and impurity diffusion regions Dtp5 and Dtp6. The device isolation region includes a portion Sp1 which is in contact with the impurity diffusion region Dtp1, a portion Sp2 which is in contact with the impurity diffusion regions Dtp2 and Dtp3, a portion Sp3 which is in contact with the impurity diffusion regions Dtp4 and Dtp5, and a portion Sp4 which is in contact with the impurity diffusion region Dtp6. The separation length of the portion Sp2 of the device isolation region is Lsp1. The separation length of the portion Sp3 of the device isolation region is Lsp2. When the P-type transistors Tp1, Tp2 and Tp3 operate, the currents of the transistors flow through channels CH1, CH2 and CH3, respectively.

FIG. 15B is identical to FIG. 15A except that the device isolation region includes a portion Sp5 which is in contact with the impurity diffusion regions Dtp2 and Dtp5, the separation length of the portion Sp5 of the device isolation region being Lsp3.

In the channel of the transistor, strain is caused in the lattice by the STI stress. Therefore, when the stress is increased, the current drivability decreases in the channel portion. Since the STI stress depends on the separation length between the impurity diffusion regions, the transistors have different current capacities according to the variation of the separation length. In the example of FIG. 15, separation length Lsp1 and separation length Lsp2 are different. Accordingly, the effects of the STI stress on the channels CH1, CH2 and CH3 are also different, so that the transistors Tp1, Tp2 and Tp3 have different current capacities. Even within a channel of a transistor, if the separation width differs according to the arrangement of impurity diffusion regions of the transistor, the current drivability of the transistor lacks in uniformity along the channel, resulting in a varying current drivability. For example, in the example of FIG. 15, separation length Lsp1 and separation length Lsp3 are different, and accordingly, the largeness of the current of the channel CH1 passing through the cross-section taken along line a-b is different from the largeness of the current of the channel CH1 passing through the cross-section taken along line c-d. Thus, the current drivability of the transistor Tp1 lacks in uniformity along the channel CH1. As previously described, the variation in transistor characteristics caused by the STI stress cannot be reflected in the model parameters of the conventional transistor model. Therefore, the variation in transistor characteristics cannot be reproduced, resulting in deteriorated design accuracy for cells and LSI.

SUMMARY OF THE INVENTION

An objective of the present invention is to provide a cell or semiconductor device wherein variation in transistor characteristics is suppressed by using contrived shape and arrangement of impurity diffusion regions in view of the dependency of current drivability of transistors on STI stress, especially in consideration of the dependency of characteristic variation on the length of a device isolation region in the gate length direction.

The present invention provides a cell in a semiconductor device, comprising a plurality of diffusion region pairs, each of the diffusion region pairs being formed by a first impurity diffusion region which is a constituent of a transistor and a second impurity diffusion region such that the first and second impurity diffusion regions are provided side-by-side in a gate length direction with a device isolation region interposed therebetween, wherein in each of the diffusion region pairs, the first and second impurity diffusion regions have an equal length in the gate width direction and are provided at equal positions in the gate width direction, and a first isolation region portion, which is part of the device isolation region between the first and second impurity diffusion regions, has a constant separation length, and wherein the first isolation region portions in the diffusion region pairs have an equal separation length.

According to the present invention, in each of the diffusion region pairs, the first isolation region portion has a constant separation length, and the first isolation region portions have an equal separation length. Therefore, variation in transistor characteristics is suppressed.

Preferably, the cell of the present invention further includes a third impurity diffusion region adjacent to a cell edge with the device isolation region interposed therebetween, wherein a second isolation region portion, which is part of the device isolation region between the third impurity diffusion region and the cell edge, has a constant separation length which is a ½ of the separation length of the first isolation region portion.

With the above, the separation length of an isolation region portion of the cell with respect to an impurity diffusion region of an adjacent cell is constant and equal to the separation length of the device isolation region in the cell. Therefore, variation in transistor characteristics is suppressed even after arrangement of cells.

In the cell of the present invention, in at least one of the plurality of diffusion region pairs, the second impurity diffusion region is preferably a dummy impurity diffusion region which is not a constituent of a transistor.

With the above, the impurity diffusion region including a transistor is prevented from being excessively large for achieving a constant separation length of the isolation region portion. Therefore, variation in transistor characteristics is more suppressed without generating redundant parasitic capacitance.

In the cell of the present invention, in at least one of the plurality of diffusion region pairs, the length of the first impurity diffusion region in the gate length direction or in the gate width direction is preferably different from that of another impurity diffusion region which is a constituent of the same transistor.

With the above, even in a cell where the gate interval of transistors is not constant or a cell where diffusion regions of transistors do not have an equal shape, it is assured that variation in transistor characteristics is more suppressed.

In the cell of the present invention, preferably, the plurality of diffusion region pairs include first and second diffusion region pairs; and the first impurity diffusion region of the first diffusion region pair and the first impurity diffusion region of the second diffusion region pair constitute an output stage transistor for charging/discharging output load capacity of the cell.

With the above, in an isolation region portion adjacent to an impurity diffusion region of the output stage transistor, the separation length is constant and equal, variation in characteristics is suppressed at least in the output stage transistor.

In the cell of the present invention, the transistors including the first impurity diffusion regions of the diffusion region pairs have an equal gate width.

With the above, it is not necessary to elongate the shape of the impurity diffusion region in the gate width direction such that the separation length of the isolation region portion is constant. Therefore, variation in transistor characteristics is more suppressed without complicating the shape of the impurity diffusion region.

The present invention also provides a semiconductor device which includes a plurality of cells arranged in a line, wherein the plurality of cells include a plurality of cells of the present invention.

The present invention also provides a semiconductor device including a plurality of diffusion region pairs, each of the diffusion region pairs being formed by a first impurity diffusion region which is a constituent of a transistor and a second impurity diffusion region such that the first and second impurity diffusion regions are provided side-by-side in a gate length direction with a device isolation region interposed therebetween, wherein in each of the diffusion region pairs, the first and second impurity diffusion regions have an equal length in the gate width direction and are provided at equal positions in the gate width direction, and a first isolation region portion, which is part of the device isolation region between the first impurity diffusion region and the second impurity diffusion region, has a constant separation length.

The present invention also provides a semiconductor device including: a plurality of cells arranged in a line; and a periphery cell provided at an end of the cell line, the periphery cell including a first impurity diffusion region and not contributing a function of the semiconductor device, wherein the first impurity diffusion region and a second impurity diffusion region of a cell adjacent to the periphery cell have an equal length in the gate width direction and are provided at equal positions in the gate width direction, the second impurity diffusion region being adjacent to a cell edge of the periphery cell, and an isolation region portion, which is part of a device isolation region between the first and second impurity diffusion regions, has a constant separation length.

As described above, according to the present invention, in a cell or between adjacent cells, the separation length of an isolation region portion adjacent to an impurity diffusion region which is a constituent of a transistor is constant. Therefore, the effects of mechanical stress on transistors are uniform, so that variation in transistor characteristics is suppressed. Thus, a semiconductor device which has characteristics close to a desired design objective is realized.

DESCRIPTION OF THE PREFERRED EMBODIMENTS

Hereinafter, embodiments of the present invention will be described with reference to the drawings.

Embodiment 1

Figure 1:
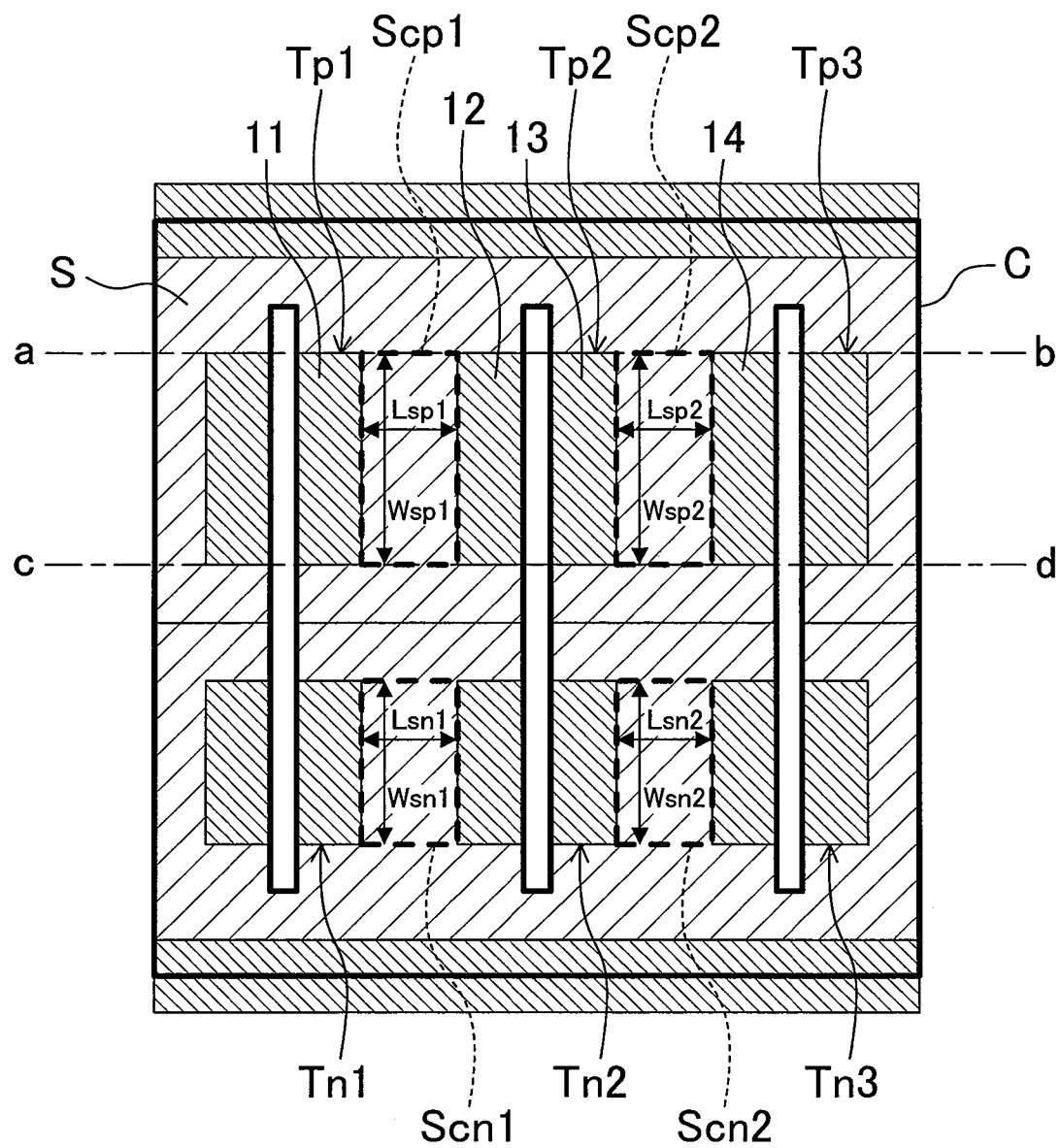
FIG. 1 is a plan view showing an example of a cell structure according to embodiment 1 of the present invention.

FIG. 1 is a plan view showing an example of a cell structure according to embodiment 1 of the present invention. As shown in FIG. 1, a cell C includes P-type transistors Tp1, Tp2 and Tp3, N-type transistors Tn1, Tn2 and Tn3, and a device isolation region S. The P-type transistors Tp1, Tp2 and Tp3 have an equal gate width. The N-type transistors Tn1, Tn2 and Tn3 have an equal gate width.

In FIG. 1, the P-type transistor placement region includes an impurity diffusion region 11 (first impurity diffusion region) which is a constituent of the P-type transistor Tp1 and an impurity diffusion region 12 (second impurity diffusion region) which is a constituent of the P-type transistor Tp2. The impurity diffusion regions 11 and 12 are provided side by side in the gate length direction with the device isolation region S interposed therebetween. The impurity diffusion regions 11 and 12 constitute a diffusion region pair. Also, the P-type transistor placement region includes an impurity diffusion region 13 (first impurity diffusion region) which is a constituent of the P-type transistor Tp2 and an impurity diffusion region 14 (second impurity diffusion region) which is a constituent of the P-type transistor Tp3. The impurity diffusion regions 13 and 14 are provided side by side in the gate length direction with the device isolation region S interposed therebetween. The impurity diffusion regions 13 and 14 constitute another diffusion region pair.

The impurity diffusion regions 11 and 12 of the diffusion region pair have an equal length in the gate width direction and are provided at equal positions in the gate width direction (as indicated by line a-b and line c-d). The impurity diffusion regions 13 and 14 of the other diffusion region pair also have an equal length in the gate width direction and are provided at equal positions in the gate width direction. Part of the device isolation region S between the impurity diffusion region 11 and the impurity diffusion region 12 is referred to as an isolation region portion Scp1 (first isolation region portion). Part of the device isolation region S between the impurity diffusion region 13 and the impurity diffusion region 14 is referred to as an isolation region portion Scp2 (first isolation region portion).

As for the isolation region portions existing between the impurity diffusion regions, the length of an isolation region portion in the gate length direction is referred to as separation length, and the length of an isolation region portion in the gate width direction is referred to as separation width. The isolation region portion Scp1 has separation length Lsp1 and separation width Wsp1, and the isolation region portion Scp2 has separation length Lsp2 and separation width Wsp2.

Likewise, the N-type transistor placement region includes diffusion region pairs. There are isolation region portions Scn1 and Scn2 (first isolation region portions) between impurity diffusion regions of the diffusion region pairs. The isolation region portion Scn1 has separation length Lsn1 and separation width Wsn1, and the isolation region portion Scn2 has separation length Lsn2 and separation width Wsn2.

Figure 2:
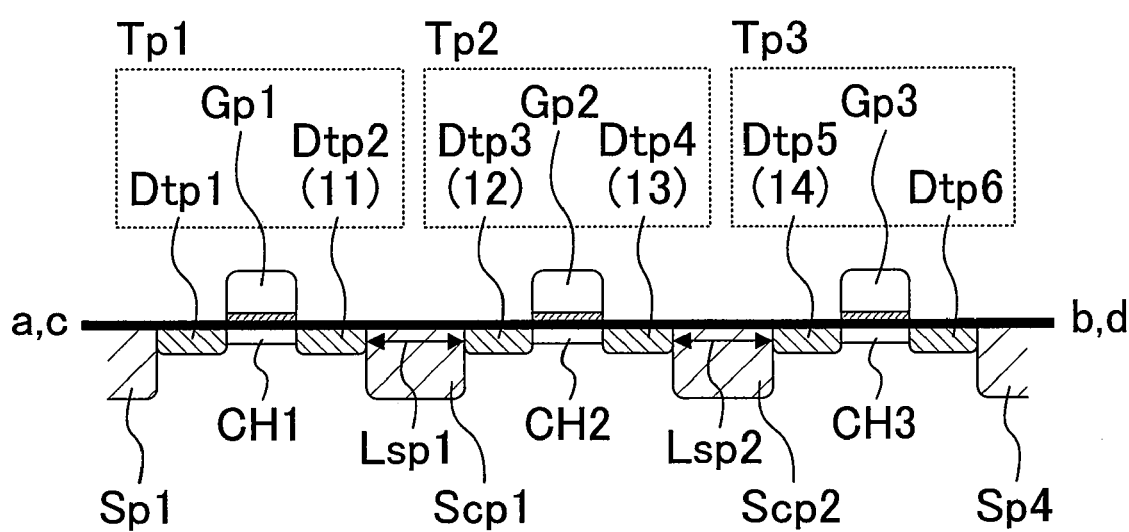
FIG. 2 is a cross-sectional view of the cell of FIG. 1.

FIG. 2 is a cross-sectional view of the cell C of FIG. 1 taken along line a-b and line c-d. It should be noted that the semiconductor device has a uniform cross-sectional structure between line a-b and line c-d. As shown in FIG. 2, the P-type transistor Tp1 is formed by a gate Gp1 and impurity diffusion regions Dtp1 and Dtp2(11). The P-type transistor Tp2 is formed by a gate Gp2 and impurity diffusion regions Dtp3 (12) and Dtp4(13). The P-type transistor Tp3 is formed by a gate Gp3 and impurity diffusion regions Dtp5(14) and Dtp6. There is a device isolation region Sp1 which is in contact with the impurity diffusion region Dtp1. The isolation region portion Scp1 is in contact with the impurity diffusion regions Dtp2 and Dtp3. The isolation region portion Scp2 is in contact with the impurity diffusion regions Dtp4 and Dtp5. There is a device isolation region Sp4 which is in contact with the impurity diffusion region Dtp6. When the P-type transistors Tp1, Tp2 and Tp3 operate, transistor currents flow in the channels CH1, CH2 and CH3, respectively.

The structural features of the cell C shown in FIG. 1 and FIG. 2 are that separation length Lsp1 of the isolation region portion Scp1 is constant within the extent of separation width Wsp1, that separation length Lsp2 of the isolation region portion Scp2 is constant within the extent of separation width Wsp2, and that separation length Lsp1 of the isolation region portion Scp1 is equal to separation length Lsp2 of the isolation region portion Scp2. Therefore, the effects of the STI stress on the channels CH1, CH2 and CH3 are uniform, so that variation in characteristics of the P-type transistors Tp1, Tp2 and Tp3 is suppressed. The same applies to the N-type transistor placement region. In the isolation region portion Scn1, separation length Lsn1 is constant within the extent of separation width Wsn1. In the isolation region portion Scn2, separation length Lsn2 is constant within the extent of separation width Wsn2. Separation length Lsn1 of the isolation region portion Scn1 is equal to separation length Lsn2 of the isolation region portion Scn2. Therefore, variation in characteristics of the P-type transistors Tn1, Tn2 and Tn3 is suppressed.

Figure 3:
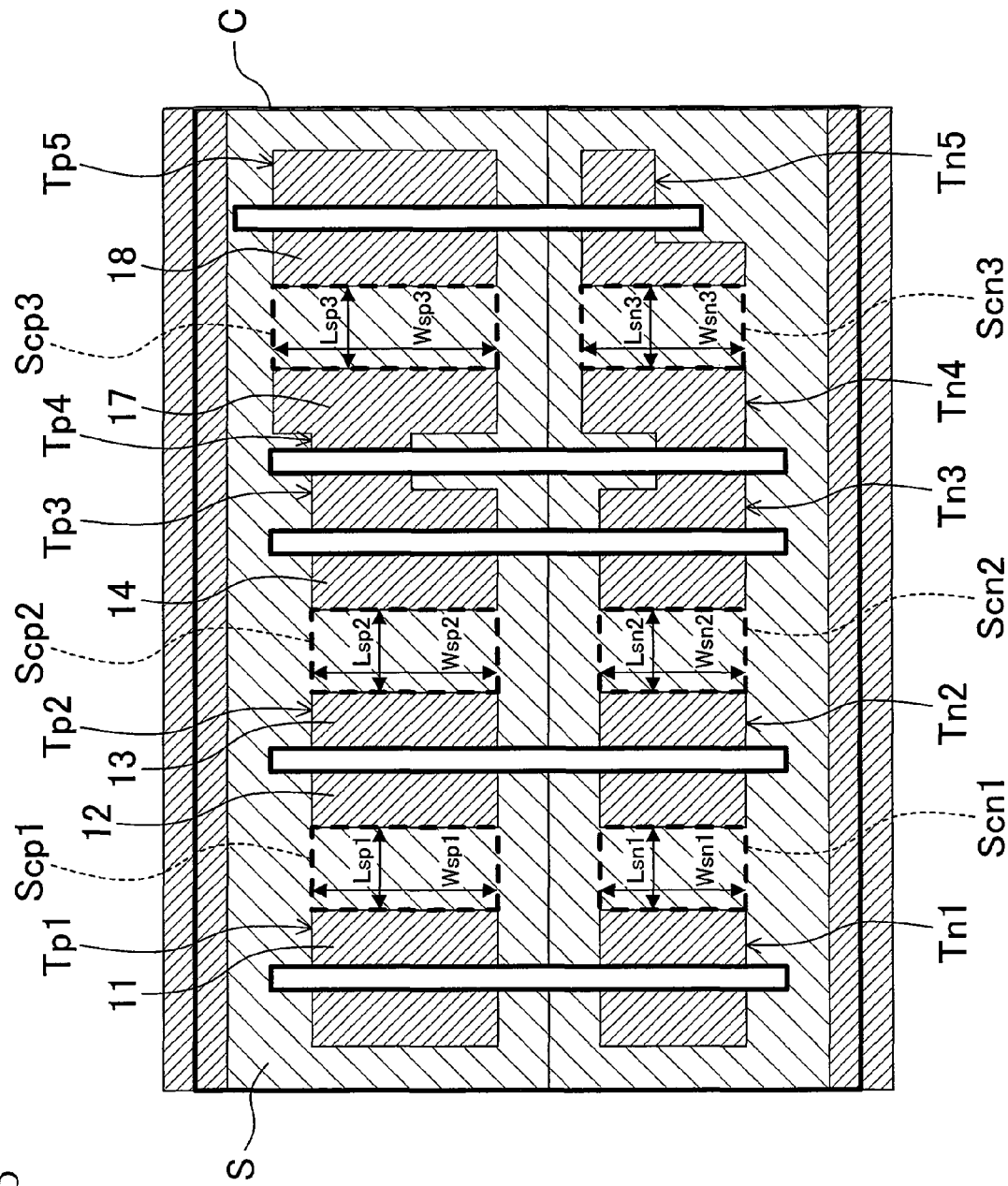
FIG. 3 is a plan view showing another example of a cell structure according to embodiment 1 of the present invention.

FIG. 3 is a plan view showing another example of a cell structure according to embodiment 1. As shown in FIG. 3, the cell C includes P-type transistors Tp1, Tp2, Tp3, Tp4 and Tp5, N-type transistors Tn1, Tn2, Tn3, Tn4 and Tn5, and a device isolation region S.

In FIG. 3, the P-type transistor placement region includes impurity diffusion regions 11 and 12, which constitute a diffusion region pair, and an isolation region portion Scp1 provided between the impurity diffusion regions 11 and 12. The impurity diffusion regions 11 and 12 have an equal length in the gate width direction and are provided at equal positions in the gate width direction. Likewise, the P-type transistor placement region includes impurity diffusion regions 13 and 14, which constitute another diffusion region pair, and an isolation region portion Scp2 provided between the impurity diffusion regions 13 and 14. The impurity diffusion regions 13 and 14 have an equal length in the gate width direction and are provided at equal positions in the gate width direction. The P-type transistor placement region further includes impurity diffusion regions 17 and 18, which constitute another diffusion region pair, and an isolation region portion Scp3 provided between the impurity diffusion regions 17 and 18. The impurity diffusion regions 17 and 18 have an equal length in the gate width direction and are provided at equal positions in the gate width direction.

The gate width of the P-type transistor Tp5 is greater than that of the other P-type transistors Tp1 to Tp4, and therefore, the length of the impurity diffusion regions 17 and 18 in the gate width direction is greater than that of the other impurity diffusion regions 11 to 14. Thus, separation width Wsp3 of the isolation region portion Scp3 is greater than each of separation widths Wsp1 and Wsp2 of the other isolation region portions Scp1 and Scp2. It should be noted that, in the isolation region portions Scp1, Scp2 and Scp3, separation lengths Lsp1, Lsp2 and Lsp3 are constant within the extent of separation widths Wsp1, Wsp2 and Wsp3, respectively. Separation lengths Lsp1, Lsp2 and Lsp3 of the isolation region portions Scp1, Scp2 and Scp3 are equal.

Likewise, the N-type transistor placement region includes diffusion region pairs and isolation region portions Scn1, Scn2 and Scn3. Separation width Wsn3 of isolation region portion Scn3 is greater than each of separation widths Wsn1 and Wsn2 of the other isolation region portions Scn1 and Scn2. In the isolation region portions Scn1, Scn2 and Scn3, separation lengths Lsn1, Lsn2 and Lsn3 are constant within the extent of separation widths Wsn1, Wsn2 and Wsn3, respectively. Separation lengths Lsn1, Lsn2 and Lsn3 of the isolation region portions Scn1, Scn2 and Scn3 are equal.

Embodiment 2

Figure 4:
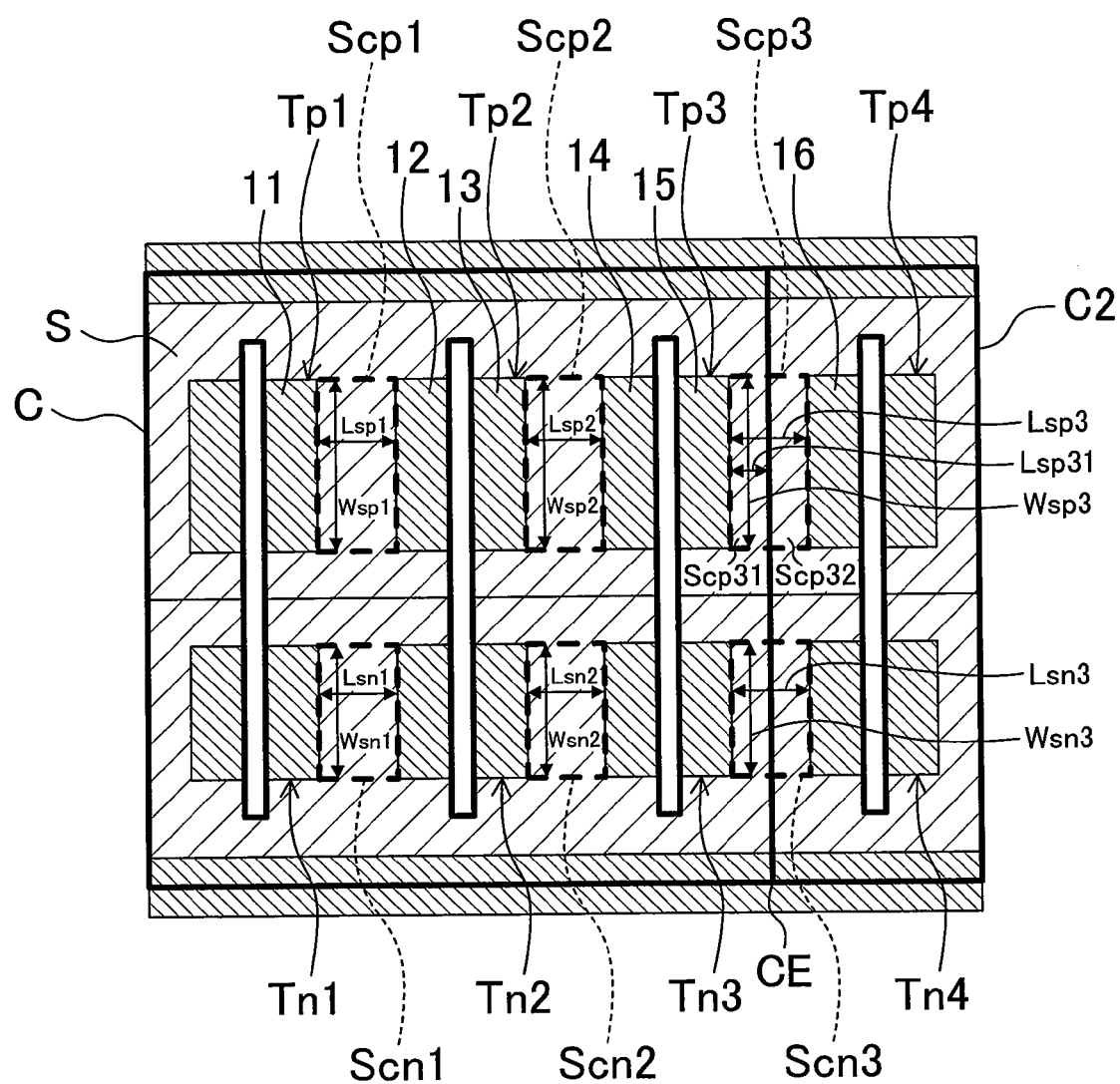
FIG. 4 is a plan view showing an example of a cell structure according to embodiment 2 of the present invention.

FIG. 4 is a plan view showing an example of a cell structure according to embodiment 2 of the present invention. As shown in FIG. 4, a cell C includes P-type transistors Tp1, Tp2 and Tp3, N-type transistors Tn1, Tn2 and Tn3, and a cell C2 includes a P-type transistor Tp4 and an N-type transistor Tn4.

Referring to FIG. 4, in the P-type transistor placement region, part of the device isolation region S between the impurity diffusion region 11 of the P-type transistor Tp1 and the impurity diffusion region 12 of the P-type transistor Tp2 is referred to as an isolation region portion Scp1. Part of the device isolation region S between the impurity diffusion region 13 of the P-type transistor Tp2 and the impurity diffusion region 14 of the P-type transistor Tp3 is referred to as an isolation region portion Scp2. The isolation region portion Scp1 has separation length Lsp1 and separation width Wsp1, and the isolation region portion Scp2 has separation length Lsp2 and separation width Wsp2.

Part of the device isolation region S between the impurity diffusion region 15 of the P-type transistor Tp3 and the impurity diffusion region 16 of the P-type transistor Tp4 is referred to as an isolation region portion Scp3. The isolation region portion Scp3 has separation length Lsp3 and separation width Wsp3. The isolation region portion Scp3 consists of an isolation region portion Scp31 of the cell C and an isolation region portion Scp32 of the cell C2.

The impurity diffusion region 15 (third impurity diffusion region) is adjacent to a cell edge CE extending in the gate length direction with the device isolation region S interposed therebetween. The isolation region portion Scp31 (second isolation region portion) is part of the device isolation region between the impurity diffusion region 15 and the cell edge CE. In the cell C2, the isolation region portion Scp32 is part of the device isolation region between the impurity diffusion region 16 which is adjacent to the cell edge CE and the cell edge CE.

Likewise, the N-type transistor placement region includes isolation region portions Scn1, Scn2 and Scn3. The isolation region portion Scn1 has separation length Lsn1 and separation width Wsn1, the isolation region portion Scn2 has separation length Lsn2 and separation width Wsn2, and the isolation region portion Scn3 has separation length Lsn3 and separation width Wsn3. Herein, the cross-sectional structure of the cells of FIG. 4 is not described for avoidance of redundancy (the same applies to the subsequent embodiments).

The structural feature of the cell C shown in FIG. 4, in addition to those of embodiment 1, is that even when the neighboring cell C2 is provided, the isolation region portion Scp3 between the cells has constant separation length Lsp3 within the extent of separation width Wsp3. To achieve this structural feature, in the cell C, the isolation region portion Scp31 between the impurity diffusion region 15 and the cell edge CE has constant separation length Lsp31 within the extent of separation width Wsp3. Further, the border between the cell C and the cell C2 (cell edge CE) is provided at the center of separation length Lsp3 such that separation length Lsp3 of the isolation region portion Scp3 is equal to each of separation lengths Lsp1 and Lsp2 of the other isolation region portions Scp1 and Scp2. In other words, separation length Lsp31 of the isolation region portion Scp31 is equal to a ½ of each of separation lengths Lsp1 and Lsp2. Thus, even when any kind of cell is adjacent to the cell C, the effects of the STI stress are uniform, so that variation in characteristics of the P-type transistors Tp1, Tp2 and Tp3 is suppressed. Since the same applies to the N-type transistor placement region, variation in characteristics of the N-type transistors Tn1, Tn2 and Tn3 is suppressed.

Embodiment 3

Figure 5:
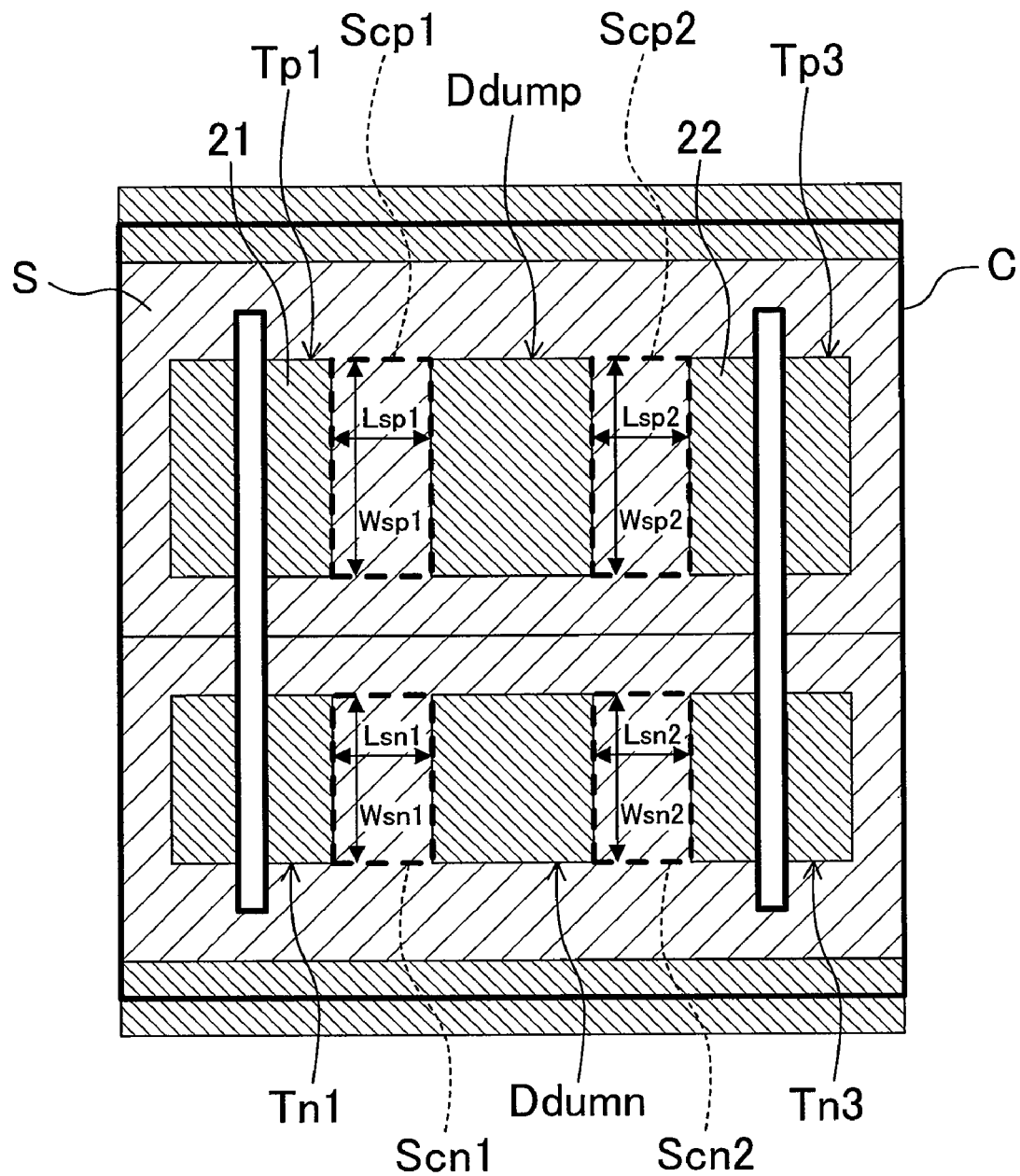
FIG. 5 is a plan view showing an example of a cell structure according to embodiment 3 of the present invention.

FIG. 5 is a plan view showing an example of a cell structure according to embodiment 3 of the present invention. As shown in FIG. 5, a cell C includes P-type transistors Tp1 and Tp3, N-type transistors Tn1 and Tn3, a P-type dummy impurity diffusion region Ddump, an N-type dummy impurity diffusion region Ddumn, and a device isolation region S.

In FIG. 5, the P-type transistor placement region includes an impurity diffusion region 21 (first impurity diffusion region), which is a constituent of the P-type transistor Tp1, and the dummy impurity diffusion region Ddump (second impurity diffusion region). The impurity diffusion region 21 and the dummy impurity diffusion region Ddump are provided side by side in the gate length direction with the device isolation region S interposed therebetween. The impurity diffusion region 21 and the dummy impurity diffusion region Ddump constitute a diffusion region pair. The P-type transistor placement region also includes an impurity diffusion region 22 (first impurity diffusion region), which is a constituent of the P-type transistor Tp3. The impurity diffusion region 22 and the dummy impurity diffusion region Ddump (second impurity diffusion region) are provided side by side in the gate length direction with the device isolation region S interposed therebetween. The impurity diffusion region 22 and the dummy impurity diffusion region Ddump constitute another diffusion region pair.

The impurity diffusion region 21 and the dummy impurity diffusion region Ddump of the diffusion region pair have an equal length in the gate width direction and are provided at equal positions in the gate width direction. The impurity diffusion region 22 and the dummy impurity diffusion region Ddump of the other diffusion region pair also have an equal length in the gate width direction and are provided at equal positions in the gate width direction. Part of the device isolation region S between the impurity diffusion region 21 and the dummy impurity diffusion region Ddump is referred to as an isolation region portion Scp1 (first isolation region portion). Part of the device isolation region S between the impurity diffusion region 22 and the dummy impurity diffusion region Ddump is referred to as an isolation region portion Scp2 (first isolation region portion). The isolation region portion Scp1 has separation length Lsp1 and separation width Wsp1. The isolation region portion Scp2 has separation length Lsp2 and separation width Wsp2.

Likewise, the N-type transistor placement region includes diffusion region pairs. There are isolation region portions Scn1 and Scn2 (first isolation region portions) between impurity diffusion regions of the diffusion region pairs. The isolation region portion Scn1 has separation length Lsn1 and separation width Wsn1, and the isolation region portion Scn2 has separation length Lsn2 and separation width Wsn2.

The structural feature of the cell C shown in FIG. 5, in addition to those of embodiment 1, is that the dummy impurity diffusion region Ddump is provided for forming the isolation region portions Scp1 and Scp2. Thus, when there is a region in which no transistor is provided, the effects of embodiment 1 can be achieved by providing a dummy impurity diffusion region. Therefore, the effects of the STI stress are uniform, so that variation in characteristics of the P-type transistors Tp1 and Tp3 is suppressed. Since the same applies to the N-type transistor placement region, variation in characteristics of the N-type transistors Tn1 and Tn3 is suppressed.

Embodiment 4

Figure 6:
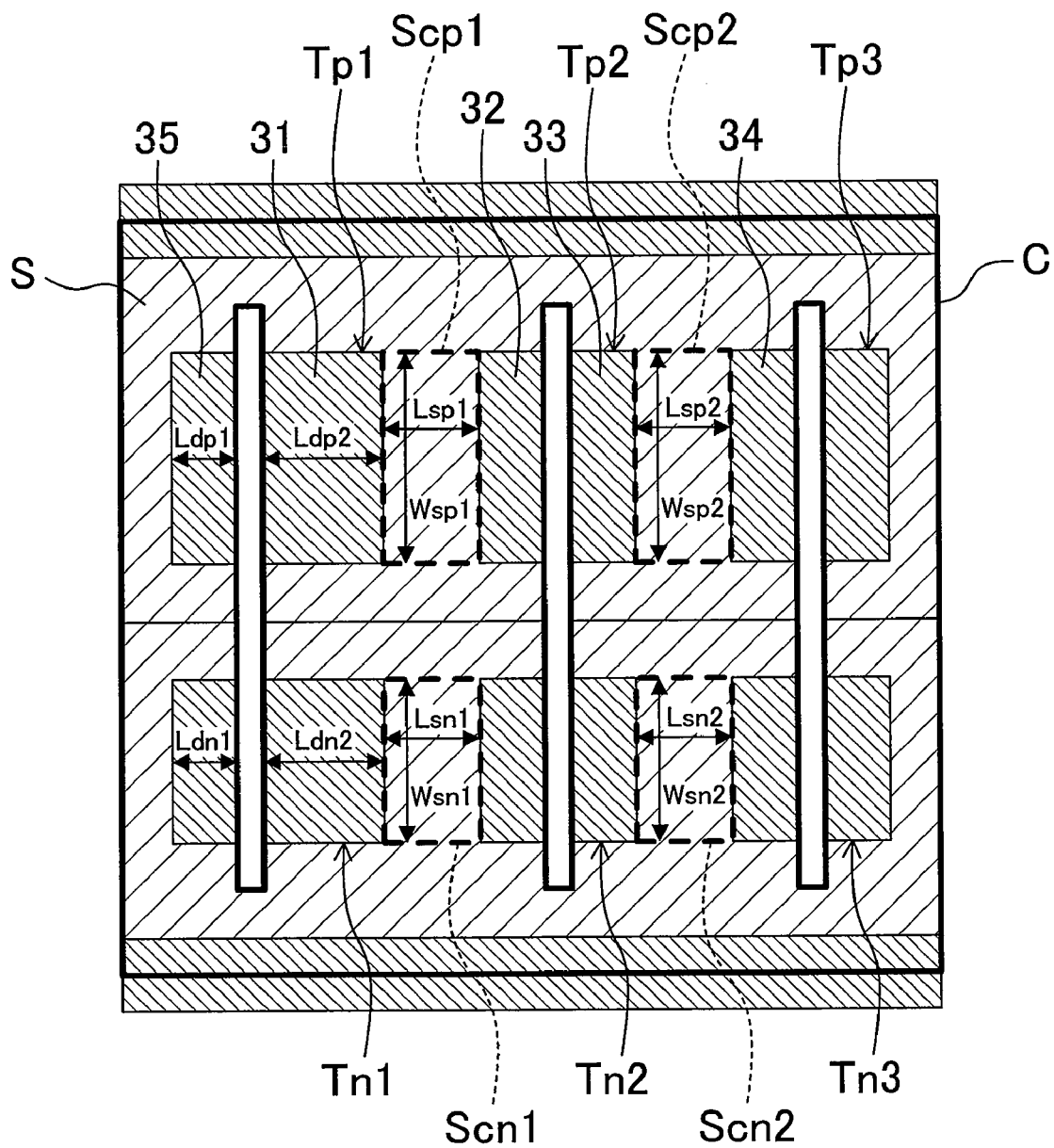
FIG. 6 is a plan view showing an example of a cell structure according to embodiment 4 of the present invention.

FIG. 6 is a plan view showing an example of a cell structure according to embodiment 4 of the present invention. As shown in FIG. 6, a cell C includes P-type transistors Tp1, Tp2 and Tp3, N-type transistors Tn1, Tn2 and Tn3, and a device isolation region S.

In FIG. 6, the P-type transistor placement region includes an impurity diffusion region 31 (first impurity diffusion region) which is a constituent of the P-type transistor Tp1 and an impurity diffusion region 32 (second impurity diffusion region) which is a constituent of the P-type transistor Tp2. The impurity diffusion regions 31 and 32 are provided side by side in the gate length direction with the device isolation region S interposed therebetween. The impurity diffusion regions 31 and 32 constitute a diffusion region pair. Also, the P-type transistor placement region includes an impurity diffusion region 33 (first impurity diffusion region) which is a constituent of the P-type transistor Tp2 and an impurity diffusion region 34 (second impurity diffusion region) which is a constituent of the P-type transistor Tp3. The impurity diffusion regions 33 and 34 are provided side by side in the gate length direction with the device isolation region S interposed therebetween. The impurity diffusion regions 33 and 34 constitute another diffusion region pair.

The impurity diffusion regions 31 and 32 of the diffusion region pair have an equal length in the gate width direction and are provided at equal positions in the gate width direction. The impurity diffusion regions 33 and 34 of the other diffusion region pair also have an equal length in the gate width direction and are provided at equal positions in the gate width direction. Part of the device isolation region S between the impurity diffusion region 31 and the impurity diffusion region 32 is referred to as an isolation region portion Scp1 (first isolation region portion). Part of the device isolation region S between the impurity diffusion region 33 and the impurity diffusion region 34 is referred to as an isolation region portion Scp2 (first isolation region portion). The isolation region portion Scp1 has separation length Lsp1 and separation width Wsp1. The isolation region portion Scp2 has separation length Lsp2 and separation width Wsp2.

Likewise, the N-type transistor placement region includes diffusion region pairs. There are isolation region portions Scn1 and Scn2 (first isolation region portions) between impurity diffusion regions of the diffusion region pairs. The isolation region portion Scn1 has separation length Lsn1 and separation width Wsn1, and the isolation region portion Scn2 has separation length Lsn2 and separation width Wsn2.

The structural feature of the cell C shown in FIG. 6, in addition to those of embodiment 1, is that the size of the impurity diffusion region 31 of the P-type transistor Tp1 in the gate length direction, i.e., diffusion length Ldp2, is greater than the normal size such that separation length Lsp1 of the isolation region portion Scp1 is equal to separation length Lsp2 of the isolation region portion Scp2. In other words, diffusion length Ldp2 of the impurity diffusion region 31 is different from diffusion length Ldp1 of the impurity diffusion region 35 which is a constituent of the P-type transistor Tp1. If the intervals between the gates of transistors are not uniform, diffusion length Ldp2 is made greater than normal diffusion length Ldp1 such that separation length Lsp1 and separation length Lsp2 are equal. As a result, the same effects as those of embodiment 1 are achieved. Therefore, the effects of the STI stress are uniform, so that variation in characteristics of the P-type transistors Tp1, Tp2 and Tp3 is suppressed. The same applies to the N-type transistor placement region. Diffusion length Ldn2 is made greater than normal diffusion length Ldn1 such that separation length Lsn1 and separation length Lsn2 are equal. Therefore, variation in characteristics of the N-type transistors Tn1, Tn2 and Tn3 is suppressed.

Embodiment 5

Figure 7:
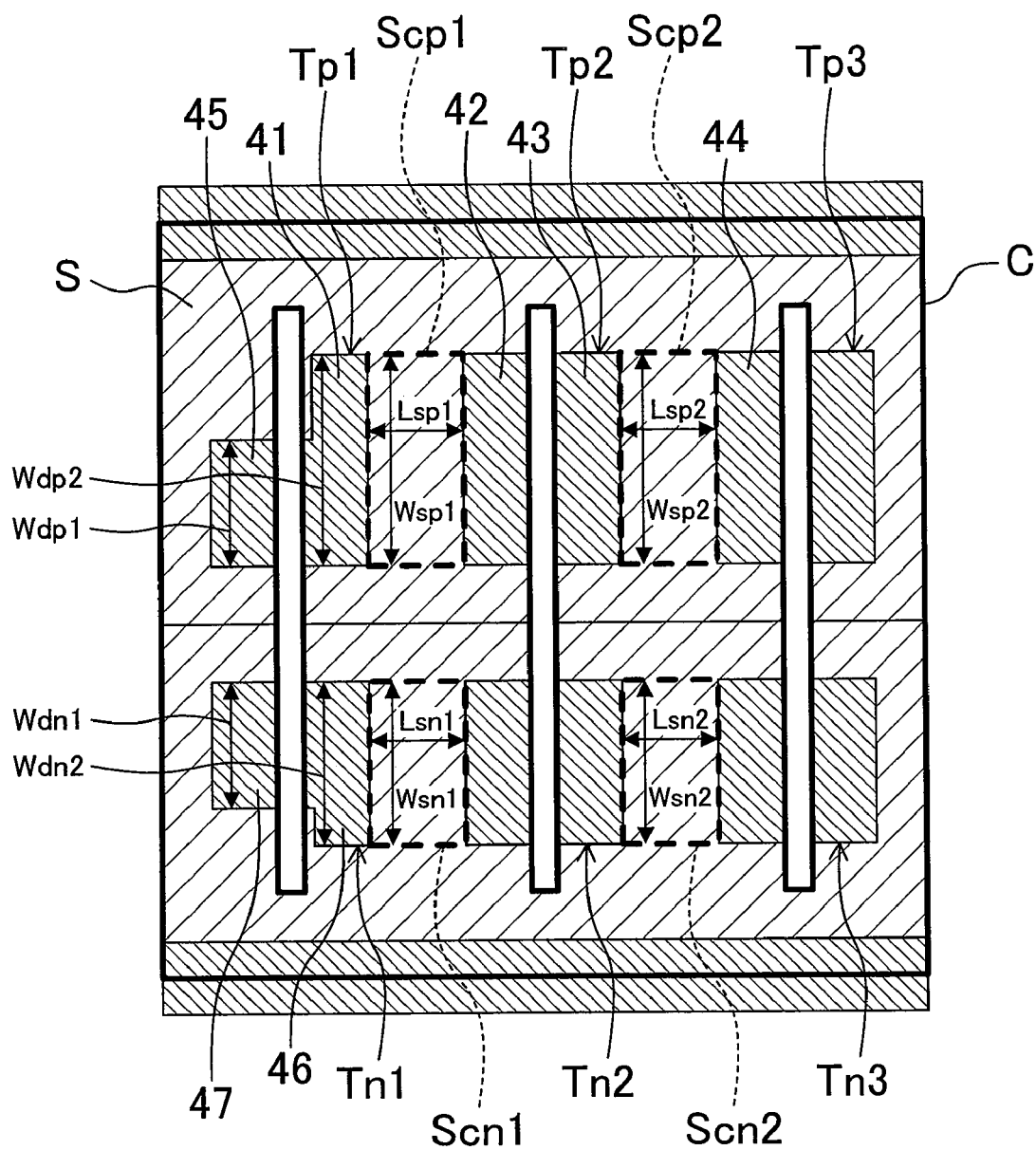
FIG. 7 is a plan view showing an example of a cell structure according to embodiment 5 of the present invention.

FIG. 7 is a plan view showing an example of a cell structure according to embodiment 5 of the present invention. As shown in FIG. 7, a cell C includes P-type transistors Tp1, Tp2 and Tp3, N-type transistors Tn1, Tn2 and Tn3, and a device isolation region S.

In FIG. 7, the P-type transistor placement region includes an impurity diffusion region 41 (first impurity diffusion region) which is a constituent of the P-type transistor Tp1 and an impurity diffusion region 42 (second impurity diffusion region) which is a constituent of the P-type transistor Tp2. The impurity diffusion regions 41 and 42 are provided side by side in the gate length direction with the device isolation region S interposed therebetween. The impurity diffusion regions 41 and 42 constitute a diffusion region pair. Also, the P-type transistor placement region includes an impurity diffusion region 43 (first impurity diffusion region) which is a constituent of the P-type transistor Tp2 and an impurity diffusion region 44 (second impurity diffusion region) which is a constituent of the P-type transistor Tp3. The impurity diffusion regions 43 and 44 are provided side by side in the gate length direction with the device isolation region S interposed therebetween. The impurity diffusion regions 43 and 44 constitute another diffusion region pair.

The impurity diffusion regions 41 and 42 of the diffusion region pair have an equal length in the gate width direction and are provided at equal positions in the gate width direction. The impurity diffusion regions 43 and 44 of the other diffusion region pair also have an equal length in the gate width direction and are provided at equal positions in the gate width direction. Part of the device isolation region S between the impurity diffusion region 41 and the impurity diffusion region 42 is referred to as an isolation region portion Scp1 (first isolation region portion). Part of the device isolation region S between the impurity diffusion region 43 and the impurity diffusion region 44 is referred to as an isolation region portion Scp2 (first isolation region portion). The isolation region portion Scp1 has separation length Lsp1 and separation width Wsp1. The isolation region portion Scp2 has separation length Lsp2 and separation width Wsp2.

The size of the impurity diffusion region 41 of the P-type transistor Tp1 in the gate width direction, i.e., diffusion width Wdp2, is greater than diffusion width Wdp1 of the impurity diffusion region 45 of the P-type transistor Tp1. Accordingly, separation width Wsp1 of the isolation region portion Scp1 corresponds to the gate width of the P-type transistor Tp2. In other words, diffusion width Wdp2 of the impurity diffusion region 41 is different from diffusion width Wdp1 of the impurity diffusion region 45 such that the impurity diffusion regions 41 and 42 of the diffusion region pair have an equal length in the gate width direction and are provided at equal positions in the gate width direction.

Likewise, the N-type transistor placement region includes diffusion region pairs. There are isolation region portions Scn1 and Scn2 (first isolation region portions) between impurity diffusion regions of the diffusion region pairs. The isolation region portion Scn1 has separation length Lsn1 and separation width Wsn1, and the isolation region portion Scn2 has separation length Lsn2 and separation width Wsn2.

Diffusion width Wdn2 of an impurity diffusion region 46 of the N-type transistor Tn1 is greater than diffusion width Wdn1 of the other impurity diffusion region 47 of the N-type transistor Tn1. Accordingly, separation width Wsn1 of the isolation region portion Scn1 corresponds to the gate width of the N-type transistor Tn2. In other words, diffusion width Wdn2 of an impurity diffusion region 46 is different from diffusion width Wdn1 of the impurity diffusion region 47 such that the impurity diffusion regions 46 and 47 of the diffusion region pair have an equal length in the gate width direction and are provided at equal positions in the gate width direction.

The structural feature of the cell C shown in FIG. 7, in addition to those of embodiment 1, is that even when the gate width of the P-type transistor Tp1 is different from the gate width of the P-type transistor Tp2, diffusion width Wdp2 of the impurity diffusion region 41 is greater than diffusion width Wdp1 of the impurity diffusion region 45 such that separation width Wsp1 of the isolation region portion Scp1 is equal to the gate width of the larger P-type transistor Tp2. Thus, the same effects as those of embodiment 1 are achieved. Therefore, the effects of the STI stress are uniform, so that variation in characteristics of the P-type transistors Tp1, Tp2 and Tp3 is suppressed. The same applies to the N-type transistor placement region. Diffusion width Wdn2 of the impurity diffusion region 46 is greater than diffusion width Wdn1 of the impurity diffusion region 47 such that separation width Wsn1 of the isolation region portion Scn1 is equal to the gate width of the larger N-type transistor Tn2. Therefore, variation in characteristics of the N-type transistors Tn1, Tn2 and Tn3 is suppressed.

Embodiment 6

Figure 8:
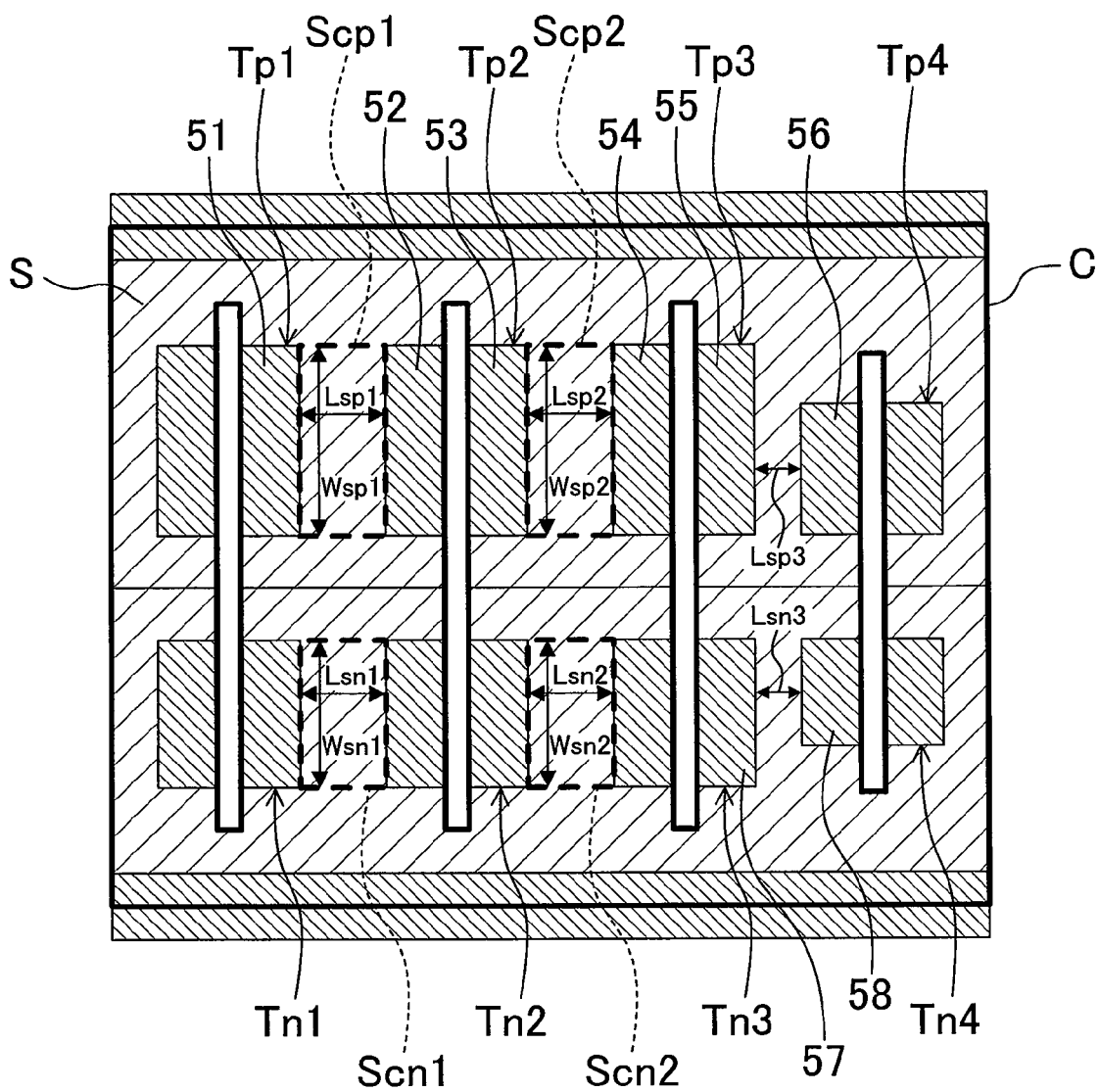
FIG. 8 is a plan view showing an example of a cell structure according to embodiment 6 of the present invention.

FIG. 8 is a plan view showing an example of a cell structure according to embodiment 6 of the present invention. As shown in FIG. 8, a cell C includes P-type transistors Tp1, Tp2, Tp3 and Tp4, N-type transistors Tn1, Tn2, Tn3 and Tn4, and a device isolation region S. Herein, the P-type transistor Tp2 is a transistor for charging/discharging the output load capacity of the cell C, i.e., an output stage transistor.

In FIG. 8, the P-type transistor placement region includes an impurity diffusion region 52 (first impurity diffusion region) which is a constituent of the P-type transistor Tp2 and an impurity diffusion region 51 (second impurity diffusion region) which is a constituent of the P-type transistor Tp1. The impurity diffusion regions 52 and 51 are provided side by side in the gate length direction with the device isolation region S interposed therebetween. The impurity diffusion regions 52 and 51 constitute the first diffusion region pair. Also, the P-type transistor placement region includes an impurity diffusion region 53 (first impurity diffusion region) which is a constituent of the P-type transistor Tp2 and an impurity diffusion region 54 (second impurity diffusion region) which is a constituent of the P-type transistor Tp3. The impurity diffusion regions 53 and 54 are provided side by side in the gate length direction with the device isolation region S interposed therebetween. The impurity diffusion regions 53 and 54 constitute the second diffusion region pair. In other words, the impurity diffusion region 52 of the first diffusion region pair and the impurity diffusion region 53 of the second diffusion region pair constitute the output stage transistor Tp2.

The impurity diffusion regions 52 and 51 of the first diffusion region pair also have an equal length in the gate width direction and are provided at equal positions in the gate width direction. The impurity diffusion regions 53 and 54 of the second diffusion region pair also have an equal length in the gate width direction and are provided at equal positions in the gate width direction. Part of the device isolation region S between the impurity diffusion region 52 and the impurity diffusion region 51 is referred to as an isolation region portion Scp1 (first isolation region portion). Part of the device isolation region S between the impurity diffusion region 53 and the impurity diffusion region 54 is referred to as an isolation region portion Scp2 (first isolation region portion). The isolation region portion Scp1 has separation length Lsp1 and separation width Wsp1. The isolation region portion Scp2 has separation length Lsp2 and separation width Wsp2. In part of the device isolation region S between an impurity diffusion region 55 of the P-type transistor Tp3 and an impurity diffusion region 56 of the P-type transistor Tp4, the interval in the gate length direction of the transistors is referred to as separation length Lsp3.

Likewise, the N-type transistor placement region includes diffusion region pairs. There are isolation region portions Scn1 and Scn2 (first isolation region portions) between impurity diffusion regions of the diffusion region pairs. The isolation region portion Scn1 has separation length Lsn1 and separation width Wsn1, and the isolation region portion Scn2 has separation length Lsn2 and separation width Wsn2. In part of the device isolation region S between an impurity diffusion region 57 of the N-type transistor Tn3 and an impurity diffusion region 58 of the N-type transistor Tn4, the interval in the gate length direction of the transistors is referred to as separation length Lsn3.

The structural features of the cell C shown in FIG. 8 are that the isolation region portions Scp1 and Scp2 exist at both sides of the P-type transistor Tp2 which serves as an output stage transistor, that separation length Lsp1 of the isolation region portion Scp1 is constant within the extent of separation width Wsp1, and that separation length Lsp2 of the isolation region portion Scp2 is constant within the extent of separation width Wsp2. Further, separation length Lsp1 of the isolation region portion Scp1 is equal to separation length Lsp2 of the isolation region portion Scp2. Therefore, the effects of the STI stress on the output stage transistor are uniform, so that variation in characteristics of the P-type transistor Tp2 is suppressed. Although the characteristics of the P-type transistors Tp1 and Tp3 can vary, the delay characteristic of the cell C does not significantly vary so long as the variation in characteristics of the P-type transistor Tp2 is suppressed by employing the structure of this embodiment, because among all the transistors the characteristics of the output stage transistor Tp2 have the greatest effects on the delay characteristic of the cell C. Further, the layout restrictions can be relaxed as compared with embodiment 1, so that the cell design flexibility is improved. The above structural features also apply to the N-type transistor placement region. In the case where the N-type transistor Tn2 is an output stage transistor, variation in characteristics of the N-type transistor Tn2 is suppressed.

As in embodiment 2, in the case where an impurity diffusion region of an output stage transistor is adjacent to a cell edge, an isolation region portion between the impurity diffusion region and the cell edge preferably has a constant separation length within the extent of its separation width. In addition, the separation length of this isolation region portion is preferably a ½ of the separation length of the other isolation region portions in the cell.

Embodiment 7

Figure 9:
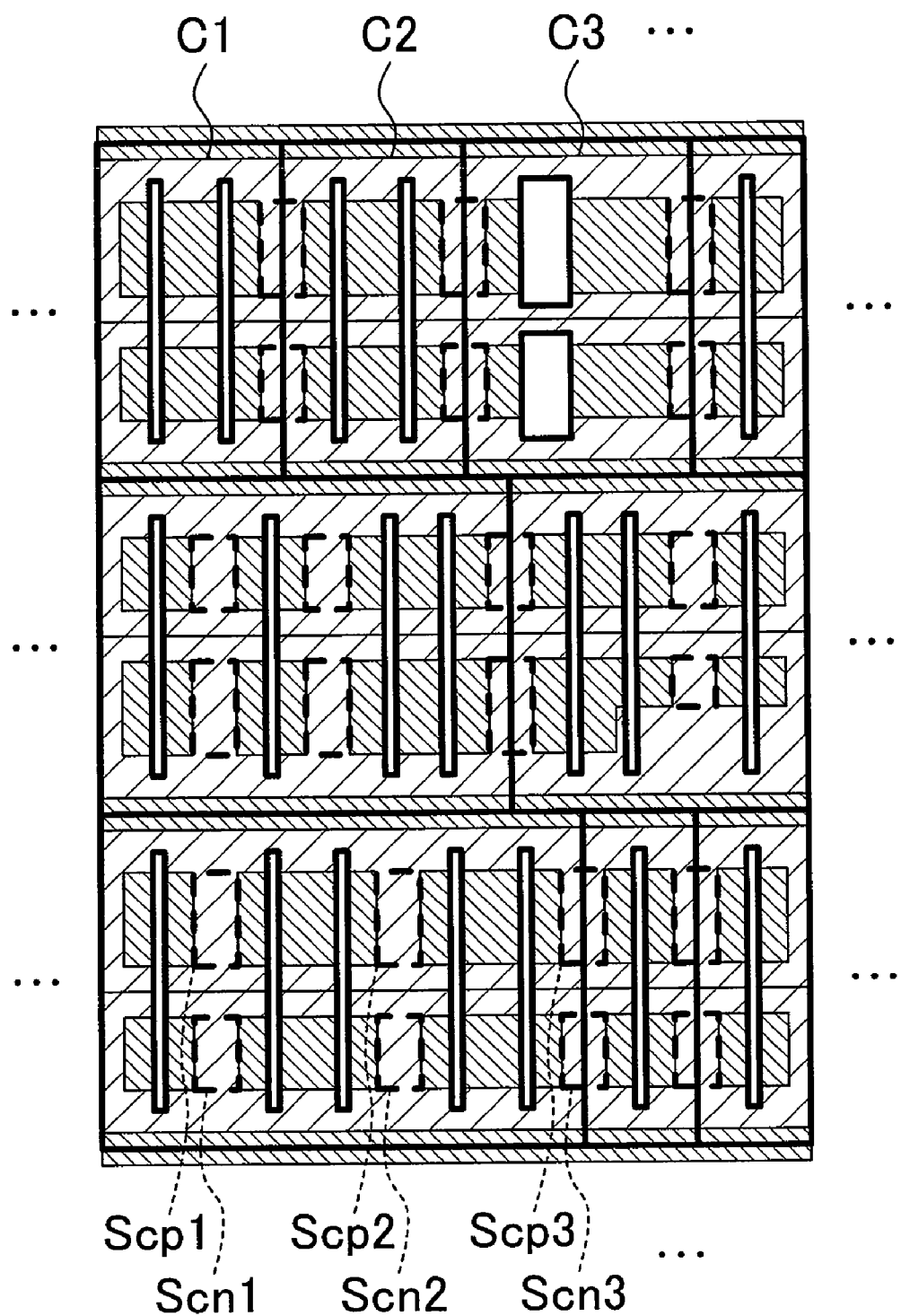
FIG. 9 is a plan view showing an example of the structure of a semiconductor device according to embodiment 7 of the present invention.

Embodiment 7 of the present invention is directed to a semiconductor device including a plurality of cells which have been described in the above embodiments. FIG. 9 shows a structure of the semiconductor device according to embodiment 7 of the present invention. The semiconductor device of FIG. 9 includes a plurality of cells C1, C2 and C3 which are arranged in lines. Most of the arranged cells have the structures described in the above embodiments. The semiconductor device of this embodiment may include capacity cells and dummy cells which do not contribute to the logical functions of the semiconductor device. In FIG. 9, the cell C3 is a capacity cell.

Therefore, diffusion region pairs are provided over almost all the area of the semiconductor device of FIG. 9, each of the diffusion region pairs being formed by a first impurity diffusion region which is a constituent of a transistor and a second impurity diffusion region, such that the first and second impurity diffusion regions are provided side-by-side in the gate length direction with a device isolation region interposed therebetween. In each diffusion region pair, the first and second impurity diffusion regions have an equal length in the gate width direction and are provided at equal positions in the gate width direction. Further, there are isolation region portions Scp1, Scp2, Scp3, . . . , and Scn1, Scn2, Scn3, . . . between the first and second impurity diffusion regions of the diffusion region pairs. Each isolation region portion has a constant separation length within the extent of its separation width. Thus, variation in characteristics is suppressed in almost all the transistors of the semiconductor device.

Figure 10:
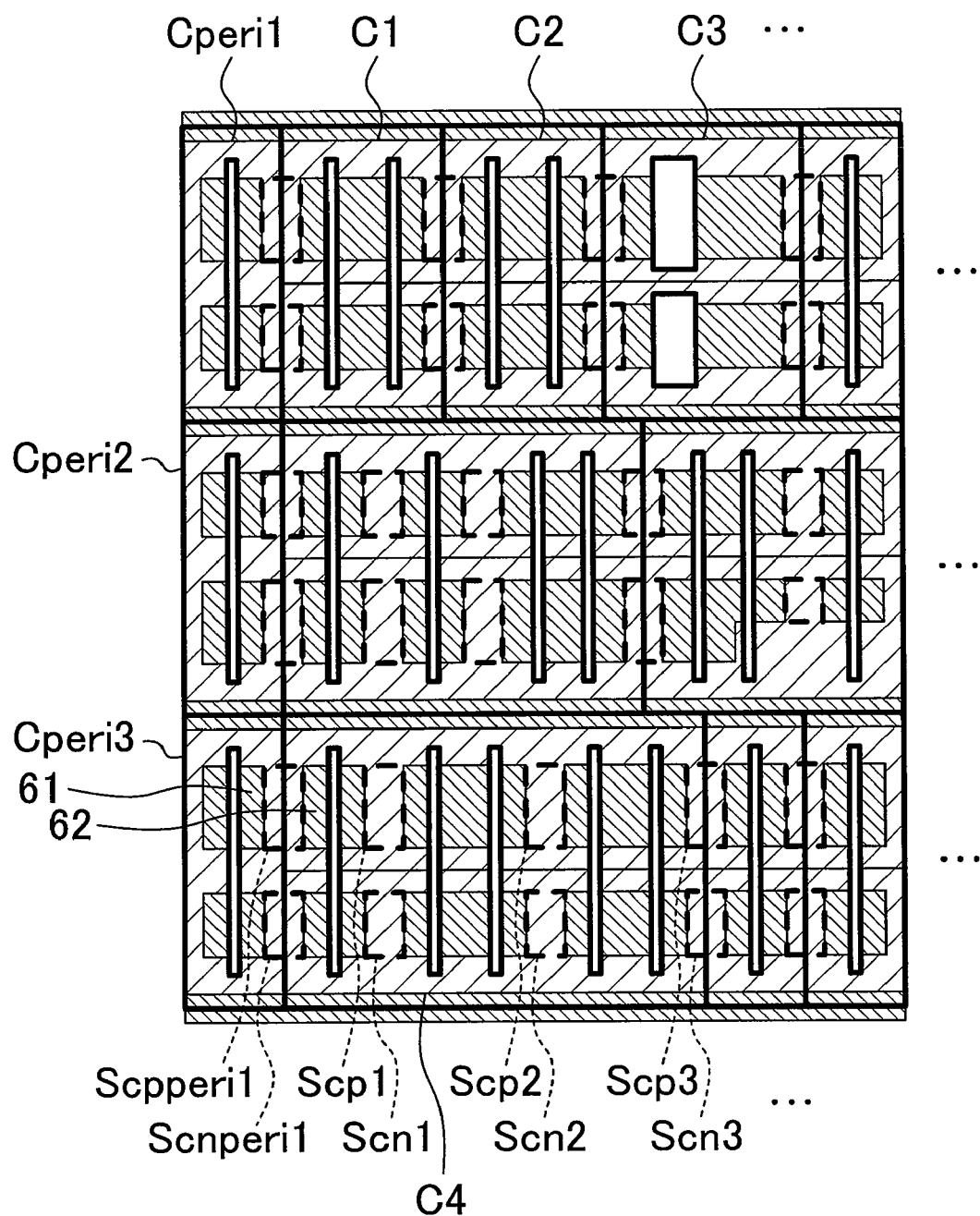
FIG. 10 is a plan view showing another example of the structure of a semiconductor device according to embodiment 7 of the present invention.
Figure 11:
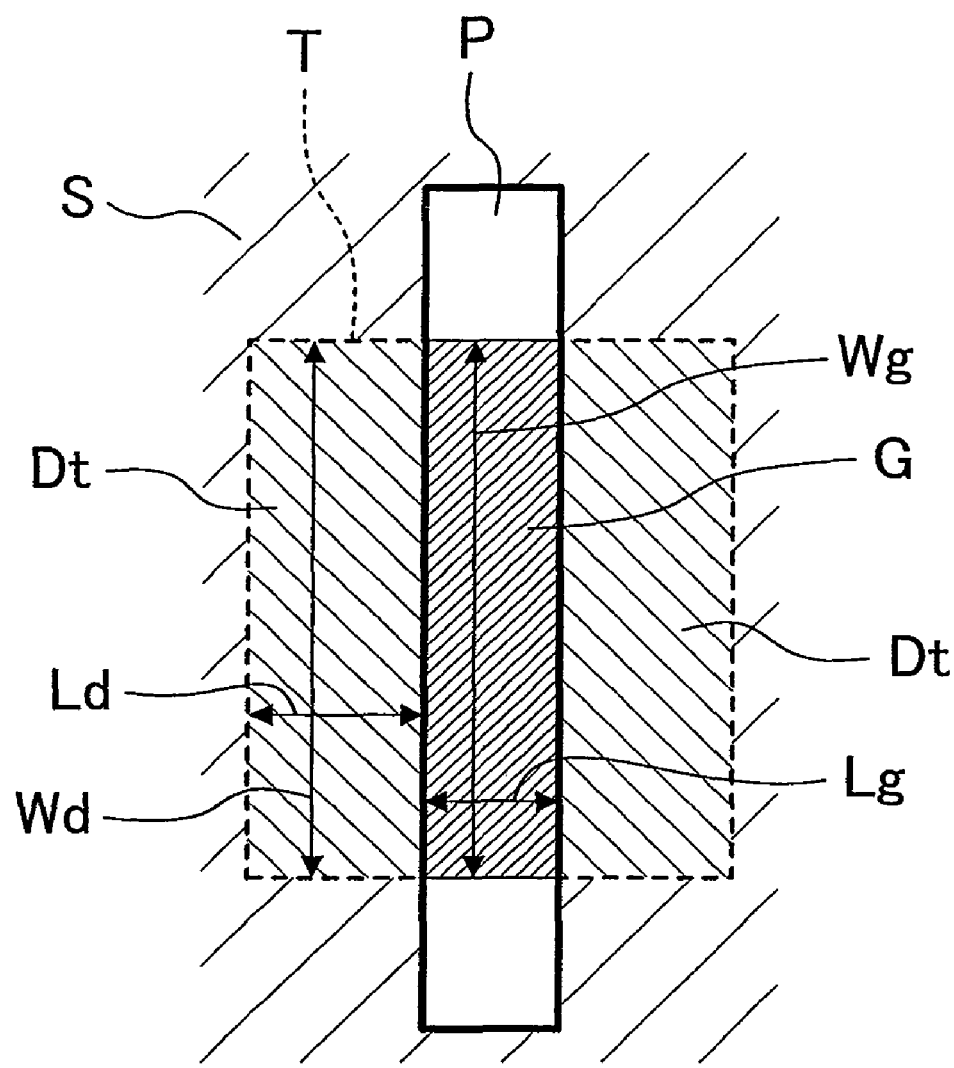
FIG. 11 is a plan view showing a generally-employed transistor.
Figure 12:
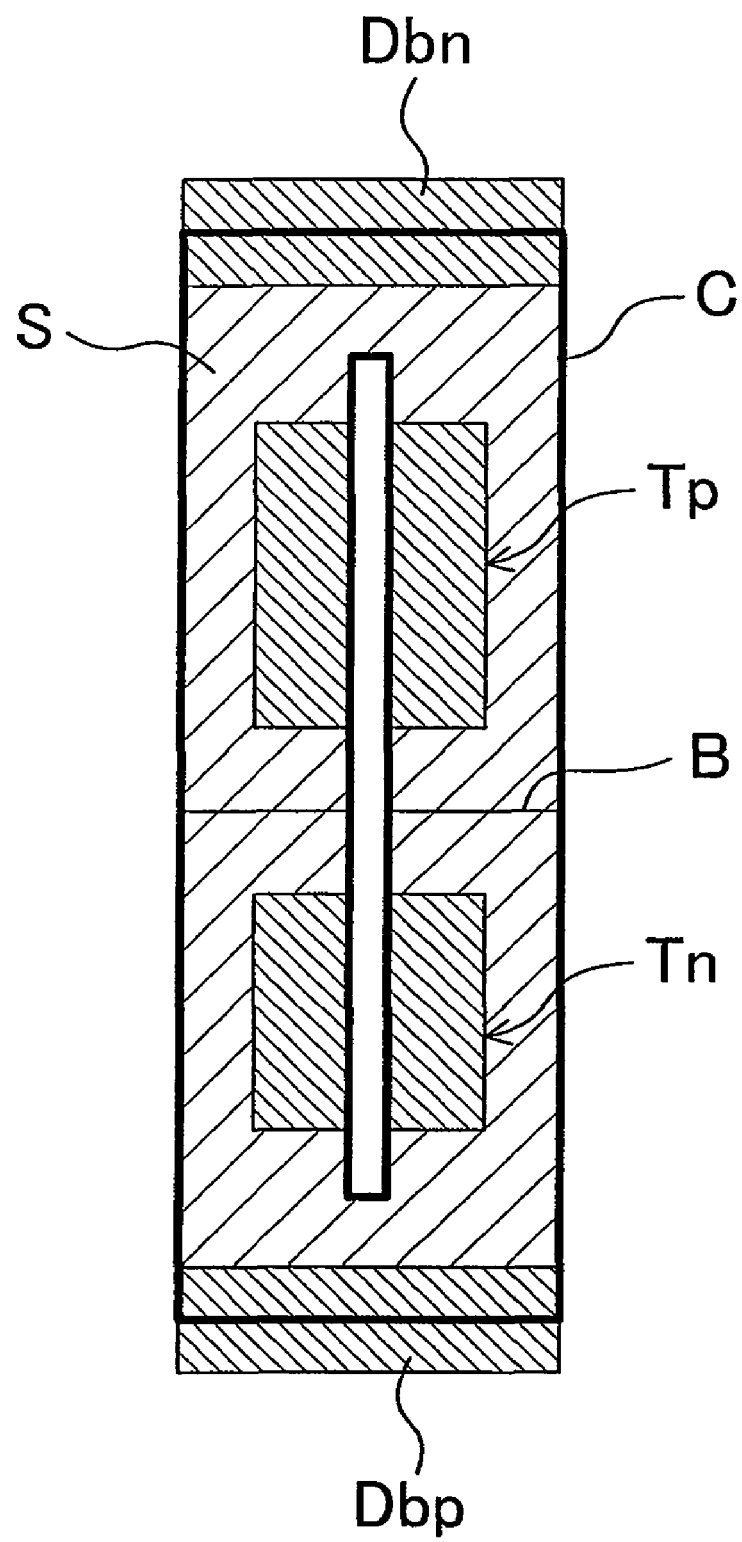
FIG. 12 is a plan view showing a generally-employed cell.
Figure 13:
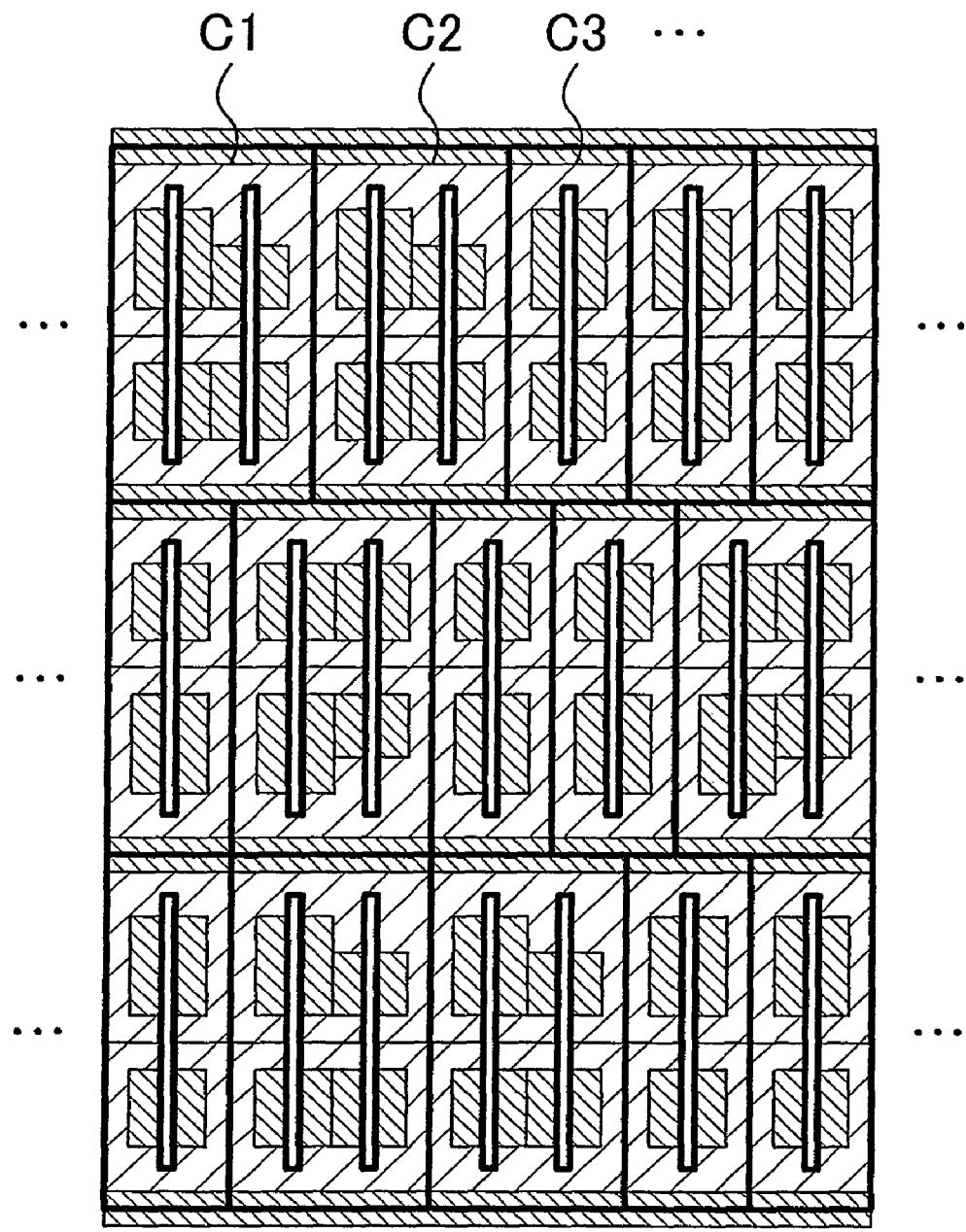
FIG. 13 is a plan view showing a generally-employed semiconductor device.
Figure 14:
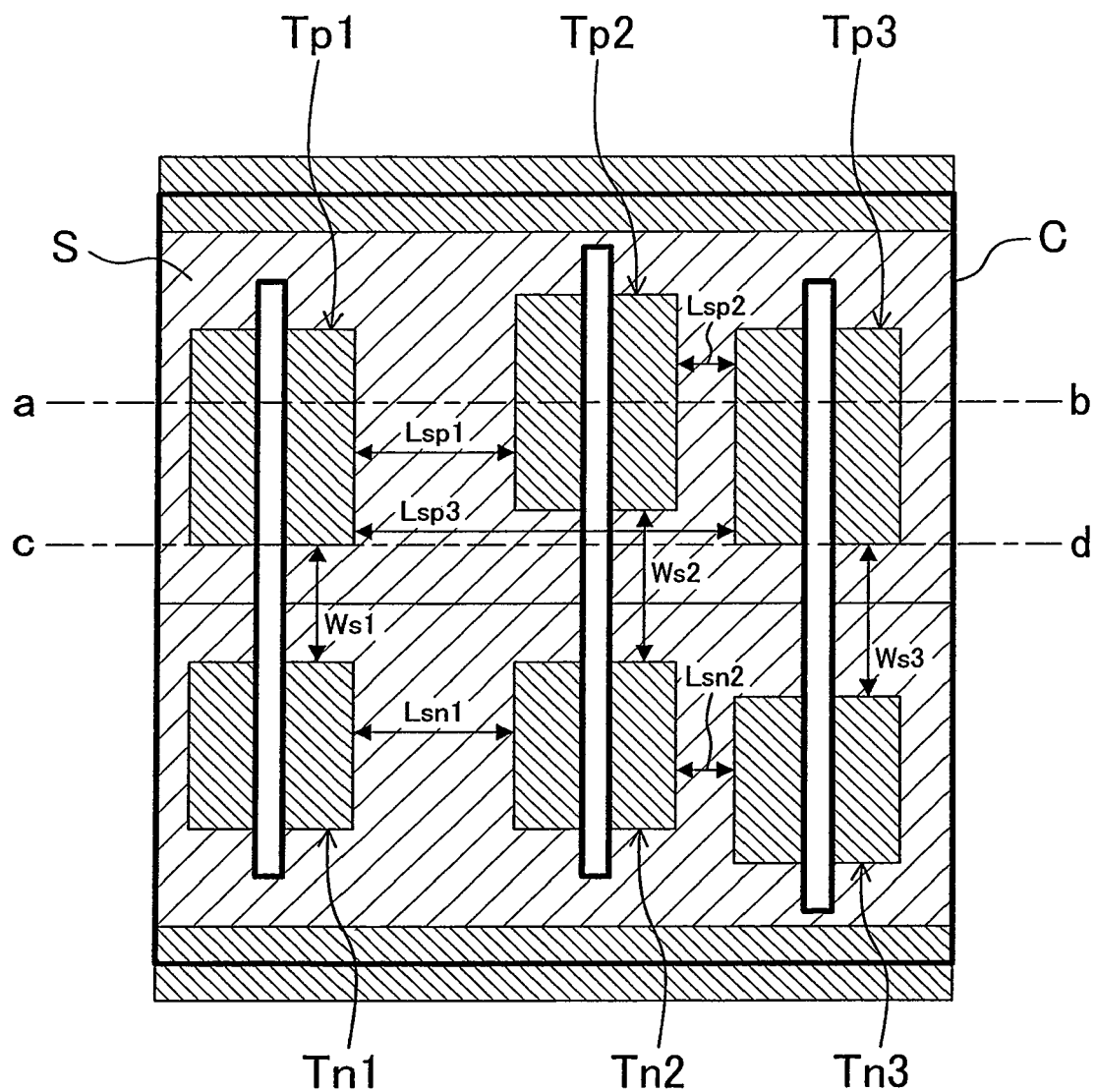
FIG. 14 is a plan view showing a cell of a conventional technique.
Figure 15A:
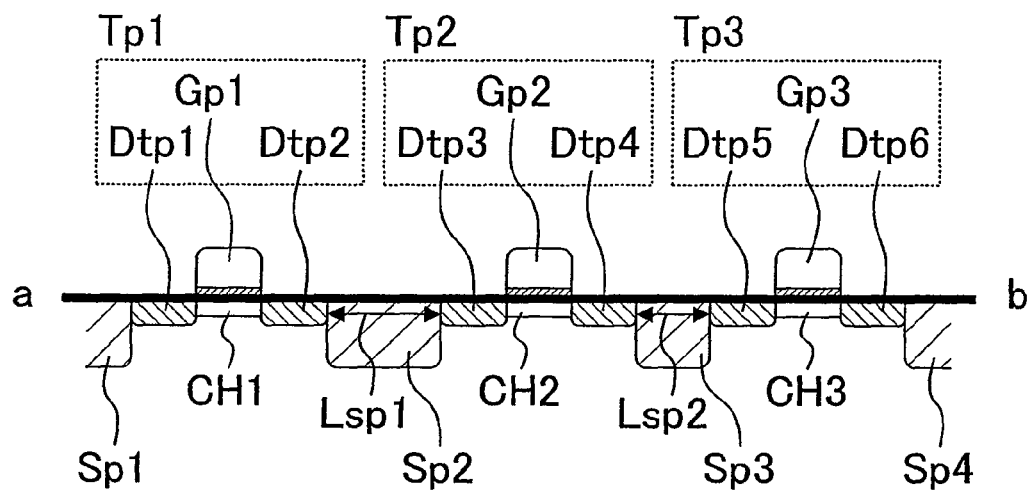
FIG. 15 is a cross-sectional view showing the cell of the conventional technique.
Figure 15B:
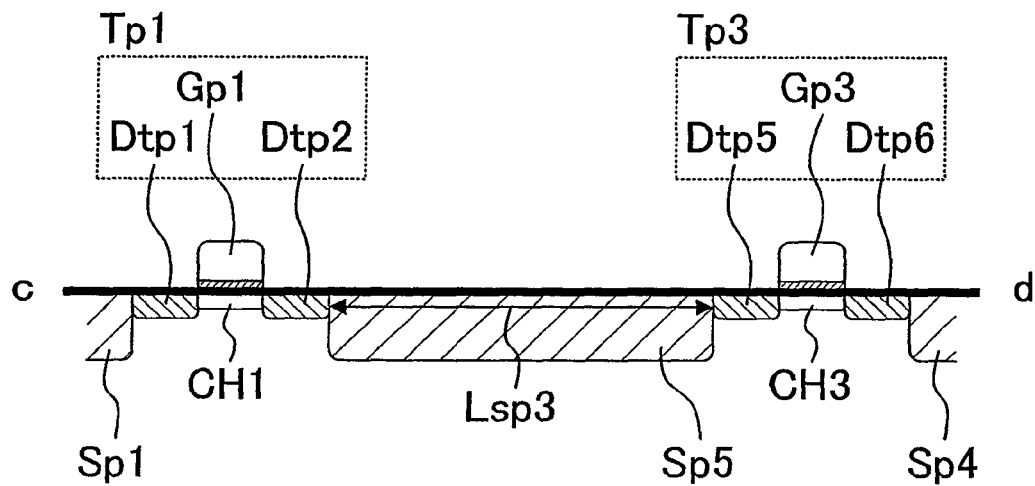

FIG. 10 is another example of the structure of a semiconductor device according to this embodiment. In the semiconductor device of FIG. 10, periphery cells Cperi1, Cperi2 and Cperi3 are provided at ends of cell lines. The periphery cells Cperi1, Cperi2 and Cperi3 may be any types of cells which do not contribute to the functions of the semiconductor device.

For example, the periphery cell Cperi3 has an impurity diffusion region 61 (first impurity diffusion region). The cell C4 which is adjacent to the periphery cell Cperi3 has an impurity diffusion region 62 (second impurity diffusion region) which is adjacent to a cell edge bordering on the periphery cell Cperi3. The impurity diffusion region 61 of the periphery cell Cperi3 and the impurity diffusion region 62 of the cell C4 have an equal length in the gate width direction and are provided at equal positions in the gate width direction. Isolation region portion Scpperi1, which is part of the device isolation region between the impurity diffusion regions 61 and 62, has a constant separation length. The same applies to isolation region portion Scnperi1 of the N-type transistor placement region. In such a way, the periphery cells Cperi1, Cperi2 and Cperi3 are provided such that a constant device separation length is achieved even at the edge of the semiconductor device.

Although in the above-described embodiments the cell structure of the present invention is employed in both the P-type transistor placement region and the N-type transistor placement region, the cell structure of the present invention may be employed only in any one of the P-type transistor placement region and the N-type transistor placement region.

According to the present invention, variation in transistor characteristics can be suppressed. Thus, the present invention is useful for, for example, improving design accuracy of semiconductor devices, reducing excessive design margins in design of semiconductor devices, and improving the operation speed of semiconductor devices.

What is claimed is:

1. A semiconductor device, comprising a plurality of diffusion region pairs, each of the diffusion region pairs being formed by a first impurity diffusion region and a second impurity diffusion region such that the first impurity diffusion region and the second impurity diffusion region are provided side-by-side in a gate length direction with a device isolation region interposed therebetween,
    wherein in at least one of the diffusion region pairs, the first impurity diffusion region forms part of a first transistor, and the second impurity diffusion region forms part of a second transistor,
    said second transistor having a gate width different in length from a gate width of the first transistor, and said first transistor includes a third impurity diffusion region,
    an edge of the first impurity diffusion region and an edge of the second impurity diffusion region, which are adjacent to one another, have an equal length in a gate width direction, and said length of said edge of the first impurity diffusion region in the gate width direction is different from a length of an edge of the third impurity diffusion region in the gate width direction, and
    a first isolation region portion, which is part of the device isolation region between the first impurity diffusion region and the second impurity diffusion region, has a separation length in the gate length direction equal to a separation length in the gate length direction of a first impurity diffusion region and a second impurity diffusion region of another one of the diffusion region pairs.

2. The semiconductor device of claim 1, wherein in at least one of the plurality of diffusion region pairs, the second impurity diffusion region is a dummy impurity diffusion region which is not a constituent of a transistor.

3. The semiconductor device of claim 1, wherein in at least one of the plurality of diffusion region pairs, the length of the first impurity diffusion region in the gate length direction is different from that of another impurity diffusion region which is a constituent of the same transistor.

4. The semiconductor device of claim 1, wherein no other transistor exists in an area between the first transistor and the second transistor.

5. The semiconductor device of claim 1, wherein the length in a gate width direction of said edge of the first impurity diffusion region is longer than the length in the gate width direction of said edge of the third impurity diffusion region.

6. The semiconductor device of claim 5, further comprising a fourth impurity diffusion region which forms part of the second transistor,
    wherein a length in the gate width direction of an edge of the fourth impurity diffusion region is equal to the length in the gate width direction of the said edge of the second impurity diffusion region.

7. The semiconductor device of claim 1, wherein the gate width of the first transistor is shorter than the gate width of the second transistor.

8. The semiconductor device of claim 1, wherein the first transistor and the second transistor have gate lengths which are equal.

9. The semiconductor device of claim 8, further comprising a third transistor located adjacent the second transistor,
    wherein the first transistor, the second transistor and the third transistor have gate lengths which are equal.

10. The semiconductor device of claim 9, wherein the second transistor and the third transistor have gate widths which are equal.

* * * * *